United States Patent [19]

Xi et al.

[11] Patent Number: 4,865,999
[45] Date of Patent: Sep. 12, 1989

[54] SOLAR CELL FABRICATION METHOD

[75] Inventors: Jianping Xi; Arun Madan, both of Golden, Colo.

[73] Assignee: Glasstech Solar, Inc., Wheat Ridge, Colo.

[21] Appl. No.: 114,694

[22] Filed: Oct. 29, 1987

Related U.S. Application Data

[63] Continuation-in-part of Ser. No. 70,975, Jul. 8, 1987, abandoned.

[51] Int. Cl.⁴ .................................... H01L 31/18
[52] U.S. Cl. ...................................... 437/2; 136/256; 136/258; 357/30; 437/4
[58] Field of Search ................... 437/2, 4, 5; 136/256, 136/258 AM; 357/30 J, 30 K, 30 Q

[56] References Cited

U.S. PATENT DOCUMENTS

| | | | |
|---|---|---|---|
| 3,880,633 | 4/1975 | Jordan | 65/60.2 |
| 3,903,427 | 9/1975 | Pack | 136/244 |
| 4,064,521 | 12/1977 | Carlson | 357/2 |
| 4,292,092 | 9/1981 | Hanak | 437/2 |
| 4,532,371 | 7/1985 | Hanak | 136/249 |

FOREIGN PATENT DOCUMENTS

| | | | |
|---|---|---|---|
| 149178 | 8/1985 | Japan | 136/244 |
| 61-284973 | 12/1986 | Japan | 136/244 |
| 61-284974 | 12/1986 | Japan | 136/244 |

*Primary Examiner*—Aaron Weisstuch
*Attorney, Agent, or Firm*—Brooks & Kushman

[57] ABSTRACT

A solar cell fabrication method and solar cell made by the method wherein a grid of point electrical connections is made to a transparent first electrode layer of the cell through a layer of a-Si semiconductor material which is sandwiched between the first electrode layer and a second back electrode layer. A dielectric layer electrically insulates the back electrode layer and the grid of point electrical connections. An electrically conducting network is deposited on the dielectric layer and electrically interconnects the grid of point electrical connections. The resulting cell has a relatively low active area loss and a relatively low electrical power loss due to the electrical connections in the cell.

8 Claims, 4 Drawing Sheets

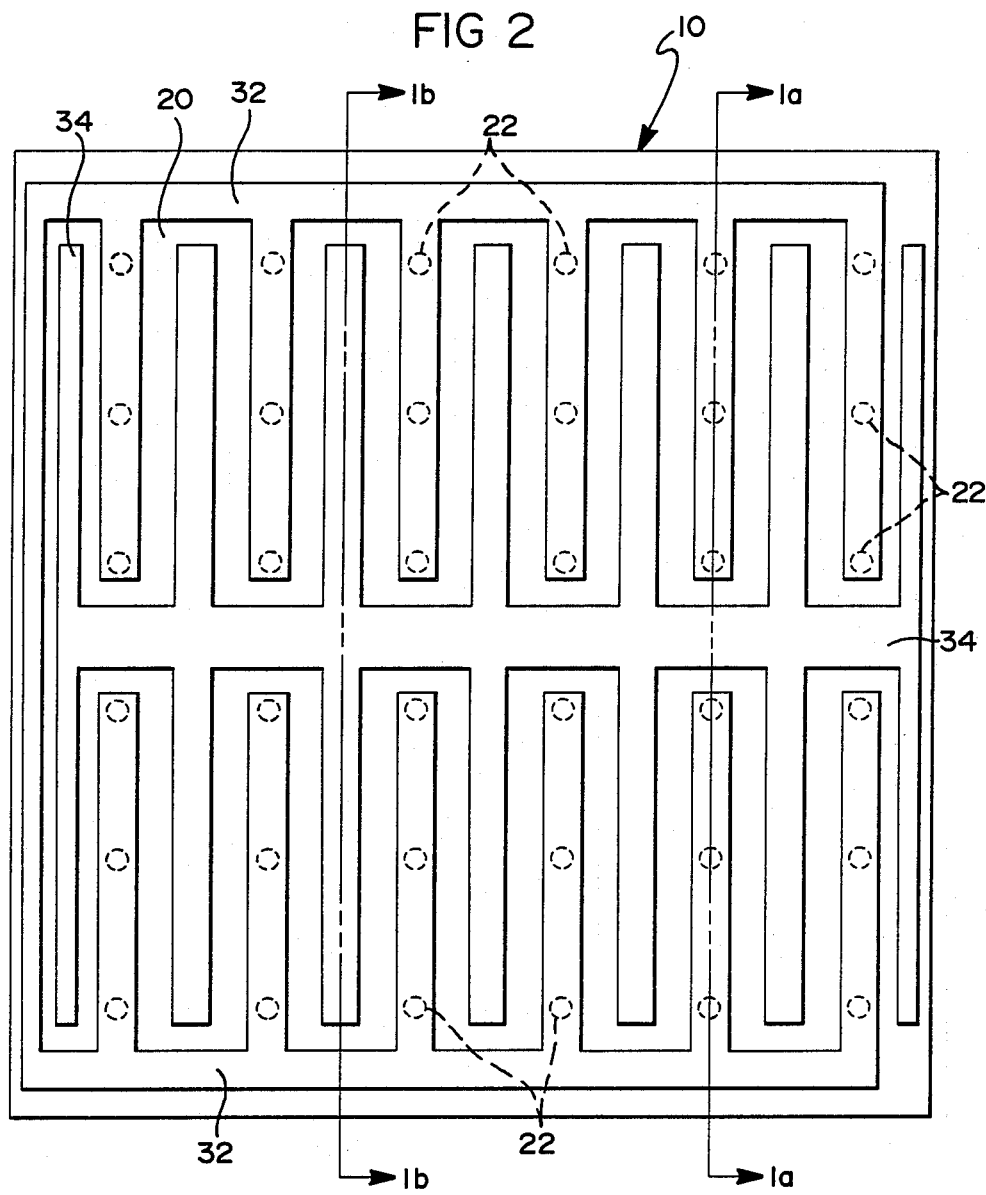

SOLAR CELL FABRICATION METHOD

CROSS-REFERENCE TO RELATED APPLICATIONS

This application is a continuation-in-part of applicant's co-pending application Ser. No. 070,975, filed July 8, 1987, now abandoned.

TECHNICAL FIELD

This invention relates to solar cell fabrication methods and solar cells made thereby wherein the solar cells have reduced active area loss and reduced power losses due to the electrical interconnections in the cells.

BACKGROUND ART

Thin film amorphous silicon solar devices are useful for converting sunlight into electrical energy. In order for photovoltaic devices to be economically feasible and be used by the general public, it is advantageous to utilize methods and materials which are inexpensive, efficient and practical. There are literally hundreds of methods and inventions relating to various manufacturing techniques attempting to achieve commercial practicality. However, solar devices are complex systems and embody a myriad of parameters in their fabrication.

One of the important parameters is the amount of active area of the solar cell device which is exposed to the light, especially for large area a-Si solar cells. Electrical connections necessary for the operation of the device block the transmission of light into the active portions of the solar cell. The electrical connections are generally opaque and located between the light incident face and the active semiconductor material. To reduce active area loss, it is advantageous to minimize the area blocked by these electrical connections.

Furthermore, in the interest of commercial feasibility and to improve active area efficiency, it is advantageous to produce electrical connections which can be manufactured quickly, inexpensively and efficiently. The resultant electrical connections must have a sufficiently low resistance to conduct electricity through the cell. A problem arises with thinning the wires or grids used as electrical connections because resistance in a thinner wire is higher than in a thicker connection. Generally, minimizing the size of an electrical connection increases $i^2R$ losses due to the increase in the resistance of the connection. Another problem is the quality of electrical contact at the interface with the conventional laser-scribing approach.

The U.S. Pat. No. 4,292,092 to Hanak discloses a laser-scribed, series-interconnected large area amorphous silicon (a-Si) solar cells. Although the scribed line can be thin, each subunit requires three scribed lines and a sufficient space between them to avoid electrical shorts. This results in a 9-31% active area loss of the solar cell panel.

In an attempt to improve the electrical connection interface, Hanak discloses a "laser punching" method in U.S. Pat. No. 4,532,371 issued July 30, 1985 to RCA Corporation. This patent to Hanak discloses a series-connected photovoltaic array wherein the series connection between a pair of adjacent photovoltaic cells comprises a plurality of "laser punched" openings extending through the semiconductor body with an electrical contact of one cell extending into the plurality of openings to provide a connection with an opposed electrical contact of the next adjacent cell.

DISCLOSURE OF THE INVENTION

An object of the present invention is to provide an improved fabrication method and a solar cell made thereby wherein the cell includes a point-like grid design which reduces active area loss and which provides good current collection capabilities with small power loss.

The method for making a solar cell in accordance with the present invention includes the step of making an electrical connection to a first electrode through semiconductor material which is sandwiched between the first electrode and a second electrode. The electrical connection is electrically insulated from the second electrode.

In a solar cell constructed in accordance with the present invention the electrical connection is provided to the first electrode for current collection therefrom.

Preferably, a plurality of such electrical connections are made and are interconnected on the back of the cell, with only the point contacts on the front, resulting in a decreased active area loss on the light incident surface and a reduced resistance loss due to the interconnections.

The invention may be practiced with all types of substrates, including glass and other transparent insulating substrates as well as any metallic or plastic substrate. Modifications would, of course, be necessary to adapt the present invention to the use of different substrates.

In the instance of a transparent substrate, such as glass, the first electrode may be a transparent conductive oxide (TCO). The point contacts are the only non-transparent material which receives the incident light. Consequently, it is desirable to have point contacts which have the smallest possible area in order to expose the highest possible active area of semiconductor to the light. The semiconductor material is selected from the group consisting of amorphous silicon, silicon germanium. copper indium diselenide, cadmium telluride, gallium arsenide, gallium arsenide phosphide, indium phosphide and indium gallium phosphide.

When a glass substrate having a coating of TCO for the first electrode material is used, some of the electrical power is lost due to the resistivity of the TCO. Accordingly, the point contacts are in a spaced-apart relation across the surface of the substrate at a distance determined by the resistivity of the TCO. If the TCO has a sheet resistivity of five to ten ohms per square centimeter, point contacts approximately two centimeters apart provide good current collection for the generation of electricity.

Additional advantages of the present invention (1) include an increase in the yield of product (i.e. a plurality of selectively interconnected cells) defined by the ratio of the number of good unit cells which can be connected relative to the number of total unit cells; (2) a decrease in the cost of the mass production of photovoltaic cells; and (3) an increase in the total power output per unit area of a photovoltaic cell.

An increase in the total power output is achieved by the resultant increased active area exposed to light. Due to the smaller area of the point contacts, the power output of the device is increased. In the instance of a transparent substrate which receives light through the front face, the electrical connections may be placed on the back of the cell, enabling the use of wider metallic strips or wires.

These wider and/or thicker strips exhibit decreased $i^2R$ losses In the case of a metallic substrate, the electrical connections are required on the front of the device as in conventional devices and must be much narrower in order to reduce active area loss.

BRIEF DESCRIPTION OF THE DRAWINGS

FIG. 2 is a back view of the cell with the back encapsulant removed;

BEST MODES FOR CARRYING OUT THE INVENTION

Figure 1A:
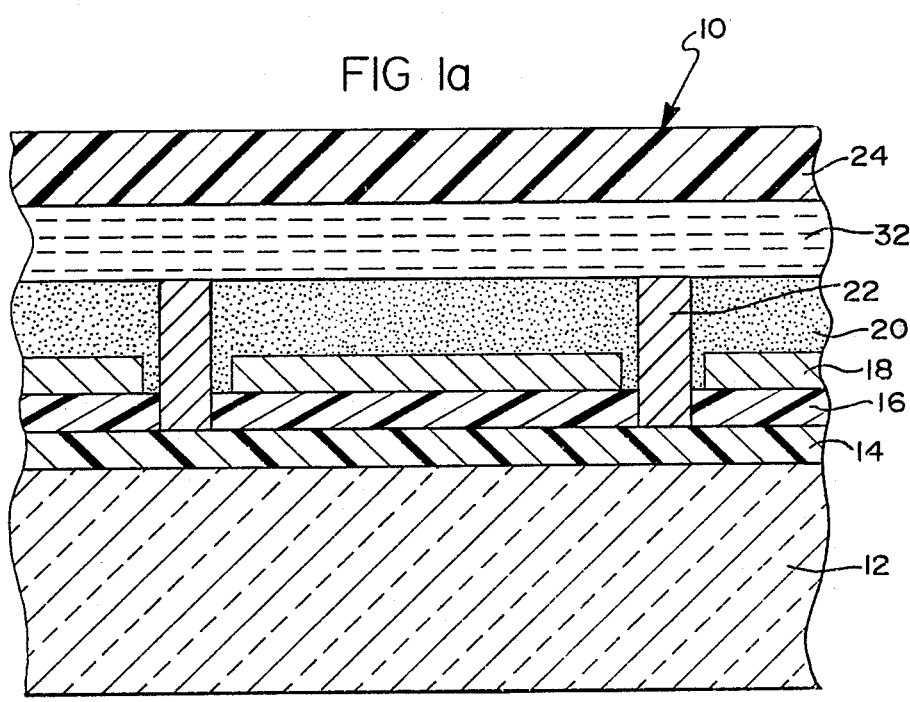
FIG. 1(a) is a side view, partially broken away and in cross-section, of a first embodiment of a solar cell having a 6×6 array of dots or point contacts taken along lines 1a—1a of FIG. 2.
Figure 1B:
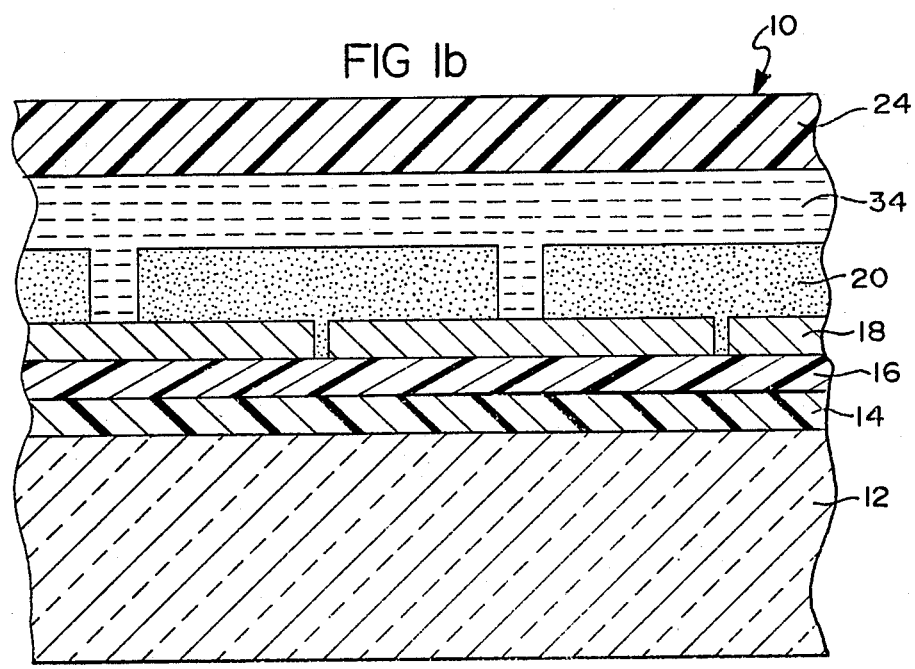
FIG. 1(b) is a side view, partially broken away and in cross-section, of the cell taken along lines 1b—1b of FIG. 2.

A solar cell constructed in accordance with the present invention is generally indicated at 10 in FIGS. 1A, 1B and 2. The solar cell 10 includes a glass substrate 12 having a surface onto which a transparent conductive oxide (i.e. TCO such as indium tin oxide) layer 14 is deposited. A-Si P-I-N layers (illustrated as a single layer 16 for simplicity) are deposited on the layer 14. A subsequent back contact electrode material layer 18 is deposited in the form of pads on top of the semiconductor layer 16.

FIG. 2 illustrates a grid pattern of dots or point electrical contacts or connections 22 at the back of the cell 10. The location and diameter of the spaced-apart point electrical contacts are illustrated so that the cell has a shading area loss of approximately 1%. The grid pattern is preferably screen-printed or otherwise deposited onto the TCO layer 14.

An insulating dielectric layer 20 is formed on top of the back electrode layer 18 while leaving an opening for each of the contacts 22 and openings for electrical connection to the pads of the layer 18.

A first metallic network of bus bars 32 is deposited on the insulating layer 20 to electrically interconnect the contacts 22. A second metallic network of bus bars 34 is also deposited on the insulating layer 20 to electrically interconnect the pads of the layer 18. The bus bars 32 and 34 form interdigitated fingers which are finally enclosed by an encapsulant 24.

The point contacts 22 are screen-printed to a height of about 3 to 500 micrometers. Each point contact is preferably formed in a substantially circular configuration having a diameter from about 0.5 to about 5.0 millimeters, although any shape or configuration may be used to maximize various properties. The contacts 22 may be made of material selected from the group consisting of silver, aluminum, copper, copper alloys and aluminum silver alloy. Alternatively, aluminum paste may be used in the screen-printing process. The diameter of each contact 22 is preferably about 1.4 mm and the space between each contact 22 is preferably about 17 mm when the sheet resistivity of the TCO layer 14 is about 5 ohms/cm$^2$.

The spaced apart relation of point contacts 22 is preferably a grid pattern in which the point contacts 22 are uniformly spaced from about 0.5 to about 10 centimeters apart across the surface of the substrate 12, depending upon the resistivity of the TCO layer 14.

The insulating layer 20 is a non-conductive polymer, such as a light-curable polymer. Electrical insulation is achieved by the layer 20 to approximately 100 or more ohms.

Referring now to FIGS. 3A through 3G, there is represented a fabrication method with reference to a second embodiment of a solar cell 10', also constructed in accordance with the present invention. The parts of the cell 10, which are the same or similar to the parts of the cell 10 have a prime designation. The cell 10' also more accurately reflects the actual microscopic structure of a cell constructed in accordance with the present invention.

Figure 3A:
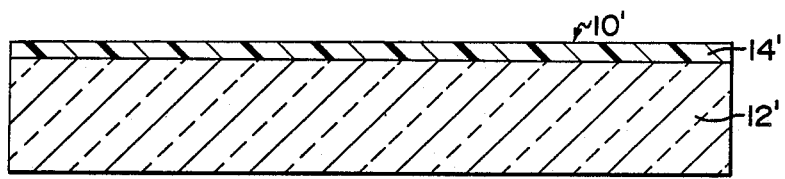
FIGS. 3A through 3E illustrate the various steps to make a second embodiment of a solar cell of the present invention and having a 3×3 array of dots or point contacts.

With reference to FIG. 3A, a transparent insulating substrate, such as a glass substrate 12', is coated with a first electrode layer 14', generally a transparent conductive oxide. Tin or indium tin oxide is preferably used.

Figure 3B:
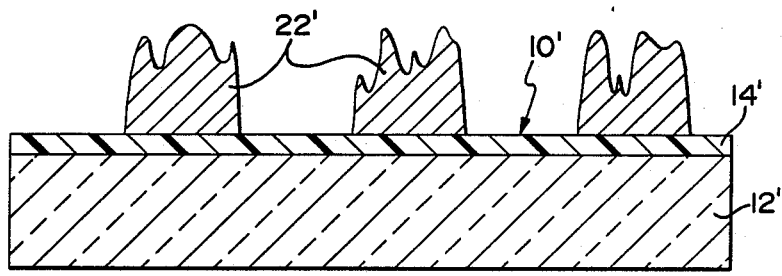

In FIG. 3B, a 3×3 grid of point electrical contacts 22' is formed by screen-printing high purity silver paste. The topographically non-uniform contacts 22' are indigenous to the screen-printing procedure.

Figure 3C:
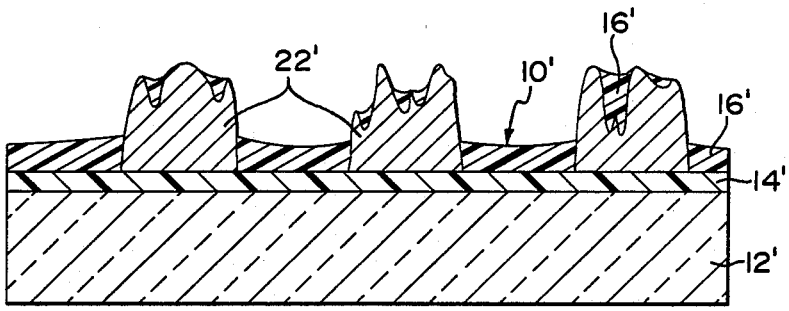

In FIG. 3C, an amorphous silicon layer 16, is deposited conformally over the entire upper surface. Generally, layers of p-type, intrinsic, and n-type amorphous silicon are plasma enhanced, chemical vapor deposited to a combined thickness of approximately 0.5 micrometers. The amorphous silicon layer 16' is shown filling the "valleys" between the point contacts 22'. The amorphous silicon layer 16' does not completely fill the "valleys" because the screen-printed point contacts 22' are so much greater in height than the amorphous silicon semiconductor material layer 16'. Also, because of the large difference in height between the point contacts 22' and the amorphous silicon layer 16', portions of the point contacts 22' remain free of the amorphous silicon. This allows electrical contact at a later time during manufacture of the cell 10' as described hereinbelow.

Figure 3D:
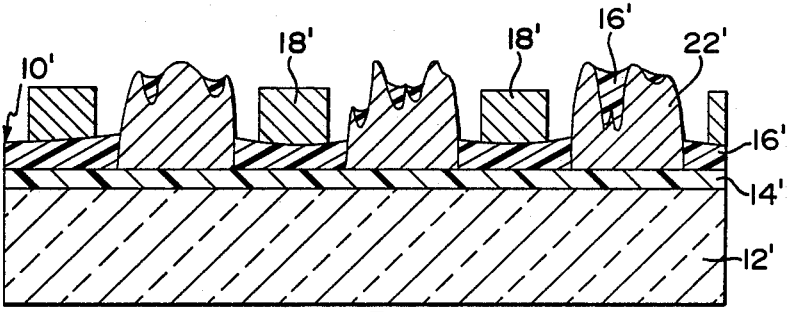

FIG. 3D illustrates the resultant shapes and locations of a back electrode material layer 18' which forms pads deposited to a thickness of approximately one micrometer. While the pads are preferably evaporated elemental silver, they may further comprise various other metallic compositions, elemental metal depositions or screen-printing in the interest of economy. For example, aluminum, copper, copper alloys and aluminum silver alloy may be suitable. In the present embodiment, the pads of the layer 18' are preferably evaporated through a mechanical mask shaped in a grid-like pattern having perpendicularly intersection lines placed over the surface of the cell 10'. At the intersection of the lines, the mask is additionally shaped slightly larger than the point contacts 22'. The mask is then situated over the upper surface and the point contacts 22' in such a manner that the silver is evaporated onto the surface of the substrate without being evaporated onto regions interconnecting the point contacts 22'. Moreover, the pads of the layer 18' may be selectively evaporated through the mask, resulting in square-shaped metallic pads being approximately 1.6 centimeters across.

Figure 3E:
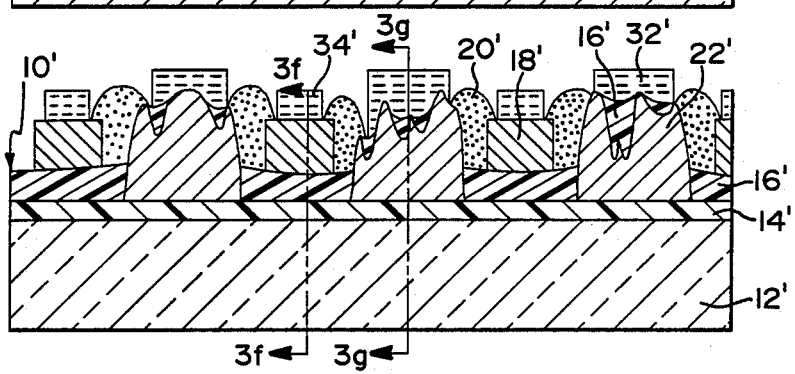
Figure 3F:
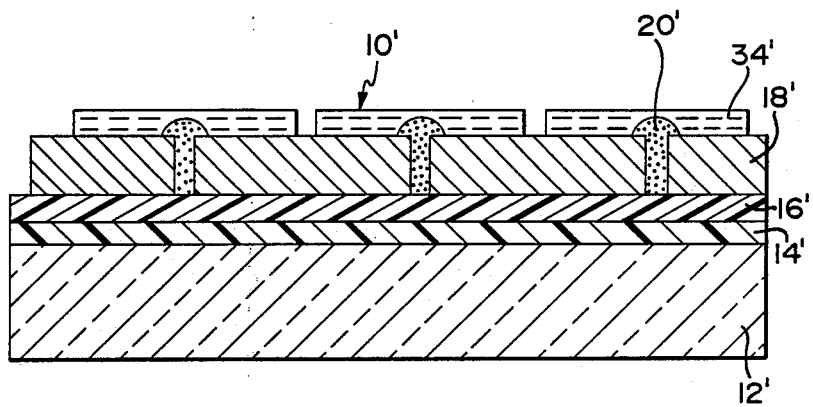
FIG. 3F is a sectional view of the cell of FIG. 3E taken along lines 3f—3f.
Figure 3G:
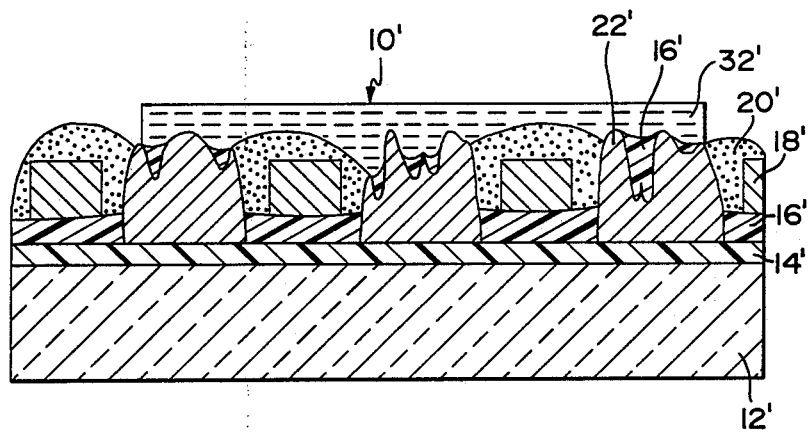
FIG. 3G is a sectional view of the cell of FIG. 3E taken along lines 3g—3g.

In FIGS. 3E, 3F and 3G an insulation material 20' is printed onto the layer 16, through a mask, having openings for each point contact 22' and each metal pad of the layer 18'. Interdigitated bus bars 32' and 34' are then screen-printed or evaporated onto the top surface of the cell 10' to interconnect the point contacts 22' together and to interconnect the metal pads of the layer 18' to each other, respectively bus bars 32' and 34' may comprise various metallic compositions or elemental metal depositions such as silver, aluminum, copper, copper alloys and aluminum silver alloy.

The point contacts 22' should be formed with such a combination of surface roughness and thickness as to produce an electrical resistance between the TCO layer 14' and the bus bar 32' of less than about three ohms. If the point contacts 22' are evaporated, or applied in a manner which forms a smooth upper surface, a sufficiently thick point contact must be formed to allow good electrical interconnections thereafter. Preferably, the point contacts 22, are greater than 10 micrometers in height to achieve this. Otherwise, the amorphous silicon layer 16' deposited thereon must be removed, or melted through with a laser or any other known method for making electrical contact through a semiconductor material.

While the best modes for carrying out the invention have been described in detail, those familiar with the art to which this invention relates will recognize various alternative ways of practicing the invention as defined by the following claims.

What is claimed is:

1. A method for making a solar cell, comprising the sequential steps of:
    depositing a transparent electrically conducting first electrode layer on a transparent substrate;
    depositing a grid of point electrical connections at isolated areas on the first electrode layer;
    depositing a layer of photovoltaic semiconductor material atop the first electrode layer;
    depositing an electrically conducting second electrode layer on the layer of photovoltaic semiconductor material and electrically insulated from the point electrical connections;
    depositing a dielectric layer on the second electrode layer; and
    depositing an electrically conducting third electrode layer on the dielectric layer, the third electrode layer electrically insulated form the second electrode layer and electrically contacting the point electrical connections.

2. A method as recited in claim 1, further comprising the step of depositing an electrically conducting fourth electrode layer on the second electrode layer, the fourth electrode layer in electrical contact with the second electrode layer at a second set of isolated areas and the fourth electrode layer electrically insulated from the third electrode layer.

3. A method as recited in claim 1, wherein the step of depositing the third electrode layer further includes the step of depositing an electrically conducting network on the dielectric layer which is in continuous electrical contact with the grid of point electrical connections.

4. A method as recited in claim 1, wherein the step of depositing the grid of point electrical connections comprises screen printing conductive paste to form the point connections.

5. A method as recited in claim 1, wherein the step of depositing the second electrode layer comprises evaporating conductive material through a mechanical mask to form a grid-like configuration.

6. A method as recited in claim 1, wherein the semiconductor material is selected from the group consisting of amorphous silicon, silicon germanium, copper indium diselenide, cadmium telluride, gallium arsenide, gallium arsenide phosphide, indium phosphide and indium gallium phosphide.

7. A method as recited in claim 1, wherein the material of each of the second and third electrode layers is selected from the group consisting of silver, aluminum, copper, copper alloys and aluminum silver alloy.

8. A method as recited in claim 1, wherein the material of the grid of point electrical connections is selected from the group consisting of silver, aluminum, copper, copper alloys and aluminum silver alloy.

* * * * *

UNITED STATES PATENT AND TRADEMARK OFFICE
CERTIFICATE OF CORRECTION

PATENT NO. : 4,865,999
DATED : September 12, 1989
INVENTOR(S) : Jianping Xi and Arun Madan It is certified that error appears in the above-identified patent and that said Letters Patent is hereby corrected as shown below:

| | | |
|---|---|---|
| Column 2, | Line 55, | Delete "(1)"; |
| | Line 56, | After "include" insert --(1)--; |
| Column 3, | Line 4, | After "losses" insert --.--; |
| Column 4, | Line 17, | Delete "10" and insert --10'--; |
| | Line 31, | Delete "16" and insert --16'--; |
| Column 5, | Line 2, | Delete "16" and insert --16'--; |
| | Line 21, | Delete "22" and insert --22'--; |
| Column 6, | Line 7, Claim 1, | Delete "form" and insert --from--. |

Signed and Sealed this

Thirtieth Day of October, 1990

Attest:

HARRY F. MANBECK, JR.

*Attesting Officer*  *Commissioner of Patents and Trademarks*